(12) United States Patent
Chang et al.

(10) Patent No.: US 11,894,441 B2
(45) Date of Patent: Feb. 6, 2024

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Chun-Ming Chang, Kaohsiung (TW); Che-Hung Huang, Hsinchu (TW); Wen-Jung Liao, Hsinchu (TW); Chun-Liang Hou, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/745,841

(22) Filed: May 16, 2022

(65) Prior Publication Data

US 2022/0278222 A1    Sep. 1, 2022

Related U.S. Application Data

(62) Division of application No. 16/666,414, filed on Oct. 29, 2019, now Pat. No. 11,367,779.

(30) Foreign Application Priority Data

Oct. 9, 2019    (CN) .......................... 201910953637.5

(51) Int. Cl.
*H01L 29/66* (2006.01)
*H01L 29/778* (2006.01)

(52) U.S. Cl.
CPC .... *H01L 29/66462* (2013.01); *H01L 29/7786* (2013.01)

(58) Field of Classification Search
CPC ..................... H01L 29/66462; H01L 29/7786
USPC ........................................................ 257/194
See application file for complete search history.

(56) References Cited

U.S. PATENT DOCUMENTS

| | | | |
|---|---|---|---|
| 9,379,191 B2 | 6/2016 | Hsu et al. | |
| 10,388,753 B1* | 8/2019 | Armstrong | ........ H01L 29/66462 |
| 2006/0214188 A1 | 9/2006 | Kawasaki | |
| 2008/0303064 A1 | 12/2008 | Sato | |
| 2010/0090225 A1* | 4/2010 | Sato | .................... H01L 29/7787 |
| | | | 257/E29.091 |
| 2010/0102357 A1 | 4/2010 | Sato | |

(Continued)

FOREIGN PATENT DOCUMENTS

| | | |
|---|---|---|
| CN | 106653825 A | 5/2017 |
| JP | 6-120258 A | 4/1994 |

OTHER PUBLICATIONS

Okita ,Title: Through Recessed and Regrowth Gate Technology for Realizing Process Stability of GaN-GITs; Proceedings of the 2016 28th International Symposium on Power Semiconductor Devices and ICs (ISPSD) ,Jun. 12, 2016.

*Primary Examiner* — Dzung Tran
(74) *Attorney, Agent, or Firm* — Winston Hsu (57) ABSTRACT

A method for fabricating high electron mobility transistor (HEMT) includes the steps of: forming a buffer layer on a substrate; forming a first barrier layer on the buffer layer; forming a first hard mask on the first barrier layer; removing the first hard mask and the first barrier layer to form a recess; forming a second barrier layer in the recess; and forming a p-type semiconductor layer on the second barrier layer.

7 Claims, 5 Drawing Sheets

(56) References Cited

U.S. PATENT DOCUMENTS

| | | | |
|---|---|---|---|
| 2010/0258841 A1* | 10/2010 | Lidow | H01L 29/66462 |
| | | | 257/192 |
| 2011/0048040 A1 | 3/2011 | Hofhaus | |
| 2012/0313106 A1 | 12/2012 | He | |
| 2013/0168685 A1 | 7/2013 | Hsu | |
| 2014/0008659 A1 | 1/2014 | Wong | |
| 2014/0239346 A1 | 8/2014 | Green | |
| 2014/0335666 A1 | 11/2014 | Koehler | |
| 2015/0318387 A1* | 11/2015 | Chiu | H01L 21/02164 |
| | | | 438/172 |
| 2017/0317184 A1 | 11/2017 | Hsu | |
| 2018/0248027 A1* | 8/2018 | Okita | H01L 27/098 |

* cited by examiner

HIGH ELECTRON MOBILITY TRANSISTOR AND METHOD FOR FABRICATING THE SAME

CROSS REFERENCE TO RELATED APPLICATIONS

This application is a division of U.S. application Ser. No. 16/666,414, filed on Oct. 29, 2019. The content of the application is incorporated herein by reference.

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of: forming a buffer layer on a substrate; forming a first barrier layer on the buffer layer; forming a first hard mask on the first barrier layer; removing the first hard mask and the first barrier layer to form a recess; forming a second barrier layer in the recess; and forming a p-type semiconductor layer on the second barrier layer.

According to another aspect of the present invention, a method for fabricating high electron mobility transistor (HEMT) includes the steps of: forming a buffer layer on a substrate; forming a barrier layer on the buffer layer; forming a first hard mask on the barrier layer; forming a second hard mask on the first hard mask; removing the second hard mask and the first hard mask to form a recess; and forming a p-type semiconductor layer on the barrier layer.

According to yet another aspect of the present invention, a high electron mobility transistor (HEMT) includes: a buffer layer on a substrate; a p-type semiconductor layer on the buffer layer; a first barrier layer between the buffer layer and the p-type semiconductor layer; a second barrier layer adjacent to two sides of the first barrier layer, wherein the first barrier layer and the second barrier layer comprise different thicknesses; a gate electrode on the p-type semiconductor layer; and a source electrode and a drain electrode adjacent to two sides of the gate electrode on the buffer layer.

These and other objectives of the present invention will no doubt become obvious to those of ordinary skill in the art after reading the following detailed description of the preferred embodiment that is illustrated in the various figures and drawings.

DETAILED DESCRIPTION

Referring to the FIGS. 1-5, FIGS. 1-5 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Figure 1:
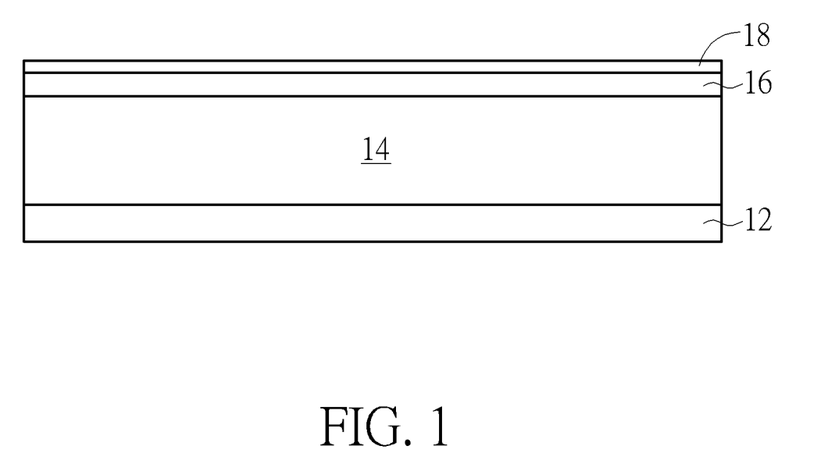
FIGS. 1-5 illustrate a method for fabricating a HEMT according to an embodiment of the present invention.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a first barrier layer 16 is formed on the surface of the buffer layer 14. In this embodiment, the first barrier layer 16 is preferably made of III-V semiconductor such as aluminum gallium nitride ($Al_xGa_{1-x}N$), in which 0<x<1, x being less than or equal to 20%, and the first barrier layer 16 preferably includes an epitaxial layer formed through epitaxial growth process. Similar to the buffer layer 14, the formation of the first barrier layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. It should be noted that even though the first barrier layer 16 is formed directly on the surface of the buffer layer 14, according to another embodiment of the present invention, it would also be desirable to form an extra metal nitride layer (not shown) including but not limited to for example aluminum nitride (AlN) between the buffer layer 14 and the first barrier layer 16, which is also within the scope of the present invention. Next, a first hard mask 18 is formed on the surface of the first barrier layer 16. Preferably, the first hard mask 18 includes silicon nitride and the thickness thereof is around 5 nm, but not limited thereto.

Figure 2:
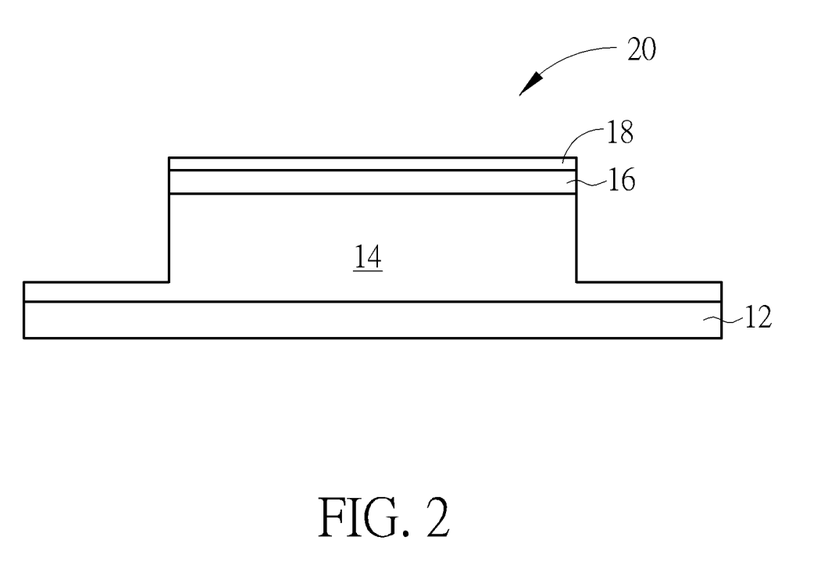

Next, as shown in FIG. 2, a MESA isolation process is conducted to define a MESA area 20 and an active area so that devices could be isolated to operate independently without affecting each other. In this embodiment, the MESA isolation process could be accomplished by conducting a photo-etching process to remove part of the first hard mask 18, part of the first barrier layer 16, and part of the buffer layer 14, in which the patterned first hard mask 18, the patterned first barrier layer 16, and the patterned buffer layer 14 preferably share equal widths and edges of the three layers are aligned. The width of the remaining un-patterned buffer layer 14 is preferably equal to the width of the substrate 12.

Figure 3:
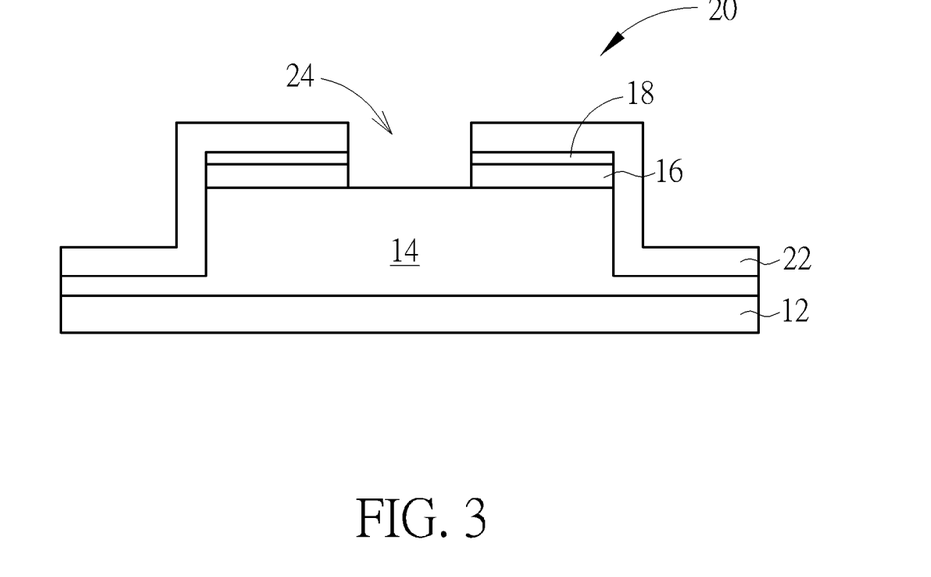

Next, as shown in FIG. 3, a second hard mask 22 is formed on the first hard mask 18, including the top surface and sidewalls of the of the first hard mask 18, sidewalls of the first barrier layer 16, sidewalls of the buffer layer 14, and surface of the buffer layer 14 adjacent to two sides of the MESA area 20. Next, another photo-etching process is conducted to remove part of the second hard mask 22, part of the first hard mask 18, and part of the first barrier layer 16 to form a recess 24 exposing the surface of the buffer layer 14.

Figure 4:
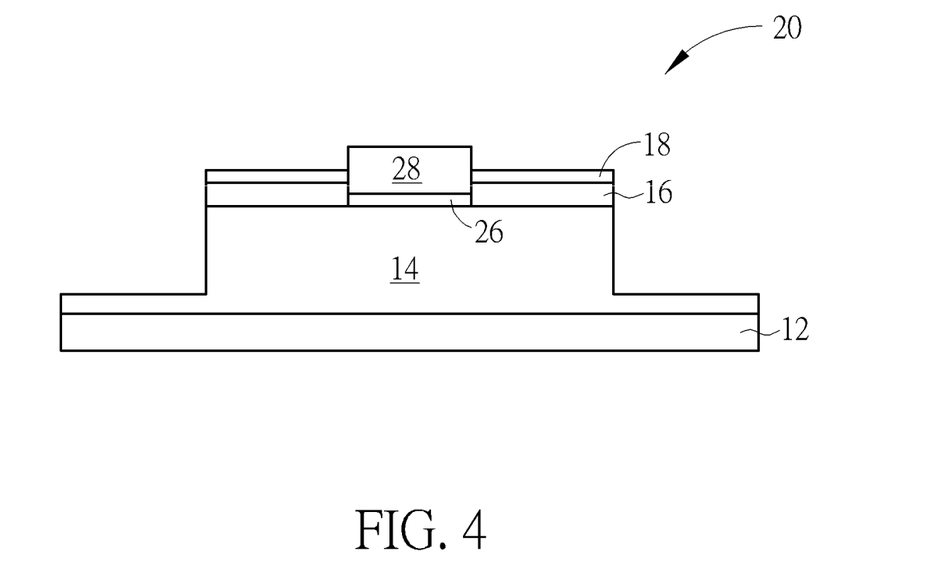

Next, as shown in FIG. 4, a second barrier layer 26 is formed in the recess 24, a p-type semiconductor layer 28 is formed on the second barrier layer 26, and part of the second hard mask 22 is removed to expose the first hard mask 18 underneath. In this embodiment, the first barrier layer 16 and the second barrier layer 26 preferably includes different concentrations of aluminum or more specifically the aluminum concentration of the second barrier layer 26 is less than the aluminum concentration of the first barrier layer 16. For instance, the first barrier layer 16 is made of III-V semiconductor such as aluminum gallium nitride ($Al_xGa_{1-x}N$), in which $0<x<1$, x being 15-50% and the second barrier layer 26 is made of III-V semiconductor such as aluminum gallium nitride ($Al_xGa_{1-x}N$), in which $0<x<1$, x being 5-15%. Preferably, the p-type semiconductor layer 28 is a III-V compound layer including p-type GaN.

Moreover, the thickness of the second barrier layer 26 is preferably less than the thickness of the first barrier layer 16, in which the thickness of the first barrier layer 16 is between 15-20 nm while the thickness of the second barrier layer 26 is between 5-15 nm. Similar to the formation of the first barrier layer 16, the formation of the second barrier layer 26 and p-type semiconductor layer 28 on the buffer layer 14 within the recess 24 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Figure 5:
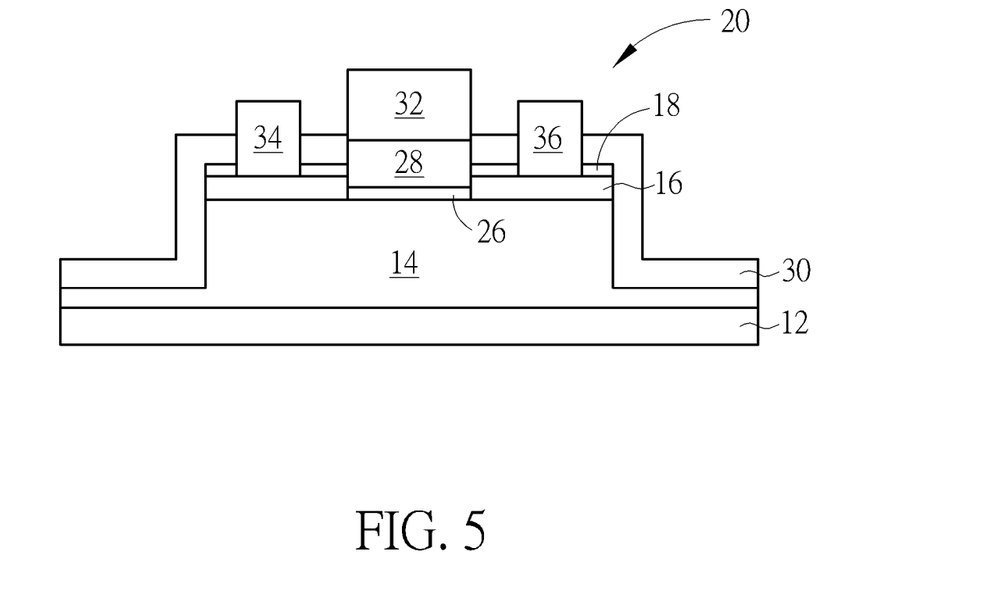

Next, as shown in FIG. 5, a passivation layer 30 is formed on the first has mask 18, the p-type semiconductor layer 28, and surface of the buffer layer 14 adjacent to two sides of the MESA area 20, a gate electrode 32 is formed on the p-type semiconductor layer 28, and a source electrode 34 and drain electrode 36 are formed adjacent to two sides of the gate electrode 32. In this embodiment, the formation of the gate electrode 32, the source electrode 34, and the drain electrode 36 could be accomplished by first conducting a photo-etching process to remove part of the passivation layer 30 directly on top of the p-type semiconductor layer 28 to form a recess (not shown), forming the gate electrode 32 in the recess, removing part of the passivation layer 30 and part of the first hard mask 18 adjacent to two sides of the gate electrode 32 to form two recesses (not shown), and then forming the source electrode 34 and drain electrode 36 in the two recesses.

In this embodiment, the gate electrode 32, the source electrode 34, and the drain electrode 36 are preferably made of metal, in which the gate electrode 32 is preferably made of Schottky metal while the source electrode 34 and the drain electrode 36 are preferably made of ohmic contact metals. According to an embodiment of the present invention, each of the gate electrode 32, source electrode 34, and drain electrode 36 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned recesses, and then pattern the electrode materials through one or more etching processes to form the gate electrode 32, source electrode 34, and the drain electrode 36. This completes the fabrication of a HEMT according to an embodiment of the present invention.

Referring again to FIG. 5, FIG. 5 further illustrates a structural view of a HEMT according to an embodiment of the present invention. As shown in FIG. 5, the HMET includes a buffer layer 14 disposed on a substrate 12, a p-type semiconductor layer 28 disposed on the buffer layer 14, a first barrier layer 16 disposed adjacent to two sides of the p-type semiconductor layer 28, a second barrier layer 26 disposed between the buffer layer 14 and the p-type semiconductor layer 28, a gate electrode 32 disposed on the p-type semiconductor layer 28, and a source electrode 34 and drain electrode 36 disposed on the first barrier layer 16 adjacent to two sides of the gate electrode 32, in which the sidewalls of the p-type semiconductor layer 28 and second barrier layer 26 are aligned.

In this embodiment, the first barrier layer 16 and the second barrier layer 26 preferably include different thicknesses such as the thickness of the second barrier layer 26 is less than the thickness of the first barrier layer 16. Moreover, the first barrier layer 16 and the second barrier layer 26 preferably includes different concentrations of aluminum or more specifically the aluminum concentration of the second barrier layer 26 is less than the aluminum concentration of the first barrier layer 16. For instance, the first barrier layer 16 is made of III-V semiconductor such as aluminum gallium nitride ($Al_xGa_{1-x}N$), in which $0<x<1$, x being 15-50% and the second barrier layer 26 is made of III-V semiconductor such as aluminum gallium nitride ($Al_xGa_{1-x}N$), in which $0<x<1$, x being 5-15%. The p-type semiconductor layer 28 preferably includes p-type GaN.

Referring to FIGS. 6-10, FIGS. 6-10 illustrate a method for fabricating a HEMT according to an embodiment of the present invention. As shown in the FIG. 6, a substrate 42 such as a substrate made from silicon, silicon carbide, or aluminum oxide (or also referred to as sapphire) is provided, in which the substrate 42 could be a single-layered substrate, a multi-layered substrate, gradient substrate, or combination thereof. According to other embodiment of the present invention, the substrate 42 could also include a silicon-on-insulator (SOI) substrate.

Figure 6:
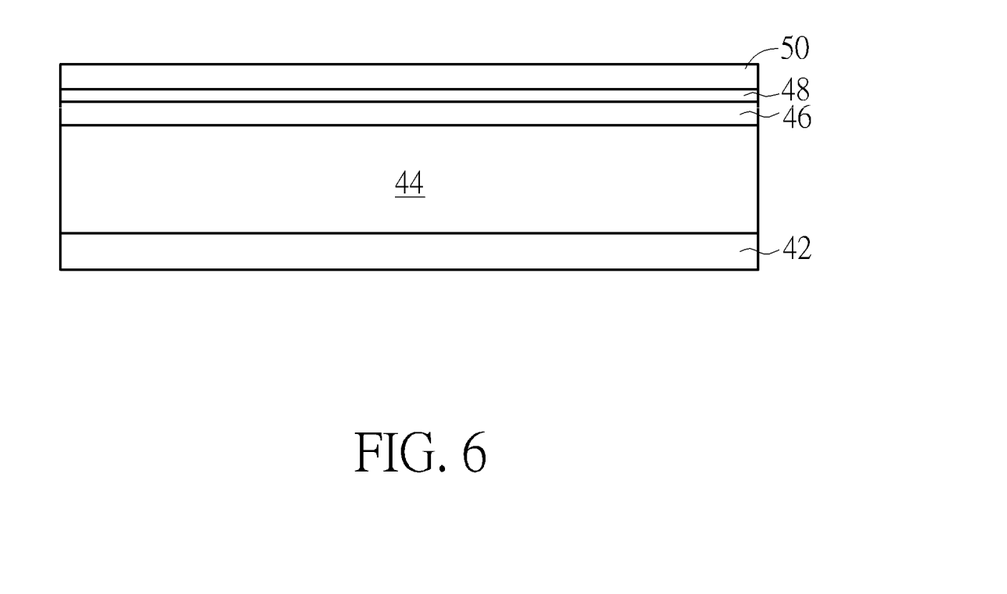
FIGS. 6-10 illustrate a method for fabricating a HEMT according to an embodiment of the present invention.

Next, a buffer layer 44 is formed on the substrate 42. According to an embodiment of the present invention, the buffer layer 44 is preferably made of III-V semiconductors such as gallium nitride (GaN), in which a thickness of the buffer layer 44 could be between 0.5 microns to 10 microns. According to an embodiment of the present invention, the formation of the buffer layer 44 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 46 is formed on the surface of the buffer layer 44. In this embodiment, the barrier layer 46 is preferably made of III-V semiconductor such as aluminum gallium nitride ($Al_xGa_{1-x}N$), in which $0<x<1$ and the barrier layer 46 preferably includes an epitaxial layer formed through epitaxial growth process. Similar to the buffer layer 44, the formation of the first barrier layer 46 on the buffer layer 44 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. It should be noted that even though the barrier layer 46 is formed directly on the surface of the buffer layer 44, according to another embodiment of the present invention, it would also be desirable to form an extra metal nitride layer (not shown) including but not limited to for example aluminum nitride (AlN) between the buffer layer 44 and the barrier layer 46, which is also within the scope of the present invention.

Next, a first hard mask 48 and a second hard mask 50 are formed on the surface of the barrier layer 46. Preferably, the first hard mask 48 and the second hard mask 50 are made of different materials, in which the first hard mask 48 includes silicon nitride and the thickness thereof is around 5 nm and the second hard mask 50 includes silicon oxide, but not limited thereto.

Figure 7:
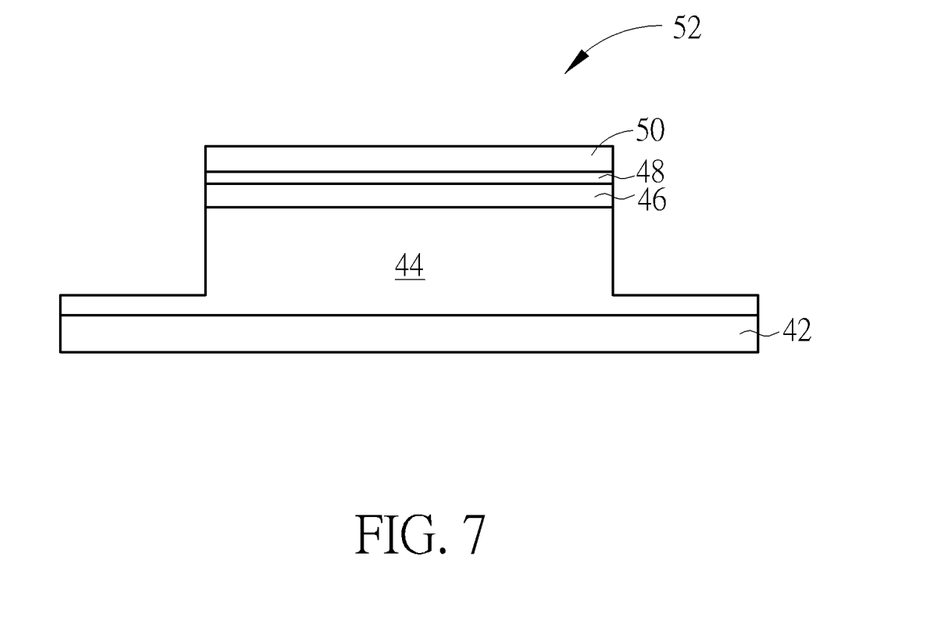

Next, as shown in FIG. 7, a MESA isolation process is conducted to define a MESA area 52 and an active area so that devices could be isolated to operate independently without affecting each other. In this embodiment, the MESA isolation process could be accomplished by conducting a photo-etching process to remove part of the second hard mask 50, part of the first hard mask 48, part of the barrier layer 46, and part of the buffer layer 44, in which the patterned second hard mask 50, the patterned first hard mask 48, the patterned barrier layer 46, and the patterned buffer layer 44 preferably share equal thickness and edges of the four layers are aligned. The width of the remaining unpatterned buffer layer 44 is preferably equal to the width of the substrate 42.

Figure 8:
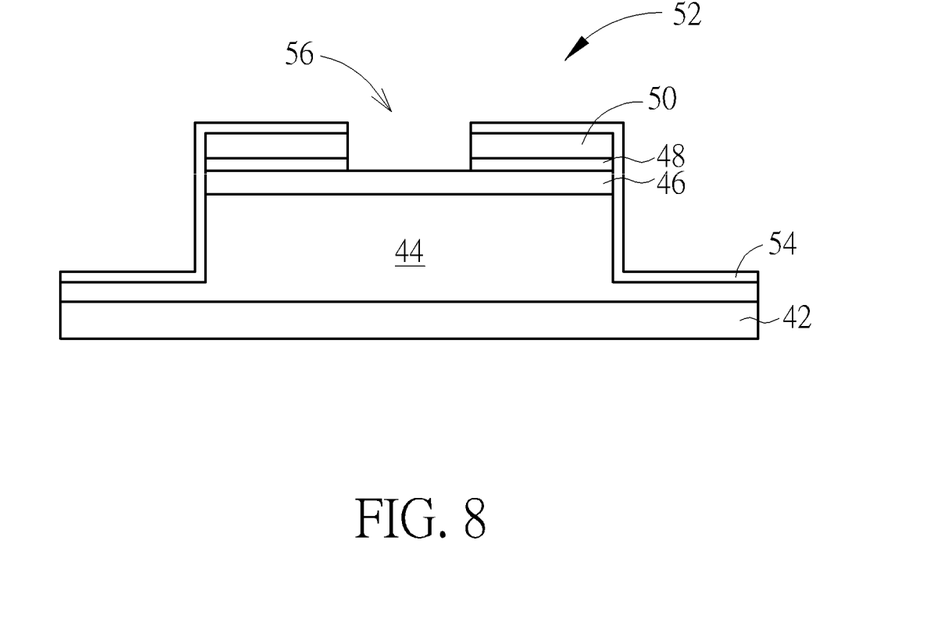

Next, as shown in FIG. 8, a third hard mask 54 is formed on the second hard mask 50, including the top surface of the second hard mask 50, sidewalls of the second hard mask 50, sidewalls of the first hard mask 48, sidewalls of the barrier layer 46, and sidewalls of the buffer layer 44, and a photo-etching process is conducted to remove part of the third hard mask 54, part of the second hard mask 50, and part of the first hard mask 48 to form a recess 56 exposing the surface of the barrier layer 46 without removing any of the barrier layer 46. In other words, the barrier layer 46 directly under the recess 56 and the barrier layer 46 adjacent to two sides of the recess 56 preferably share equal thickness after the recess 56 is formed. In this embodiment, the third hard mask 54 and the second hard mask 50 preferably include same material such as silicon oxide, but not limited thereto.

Figure 9:
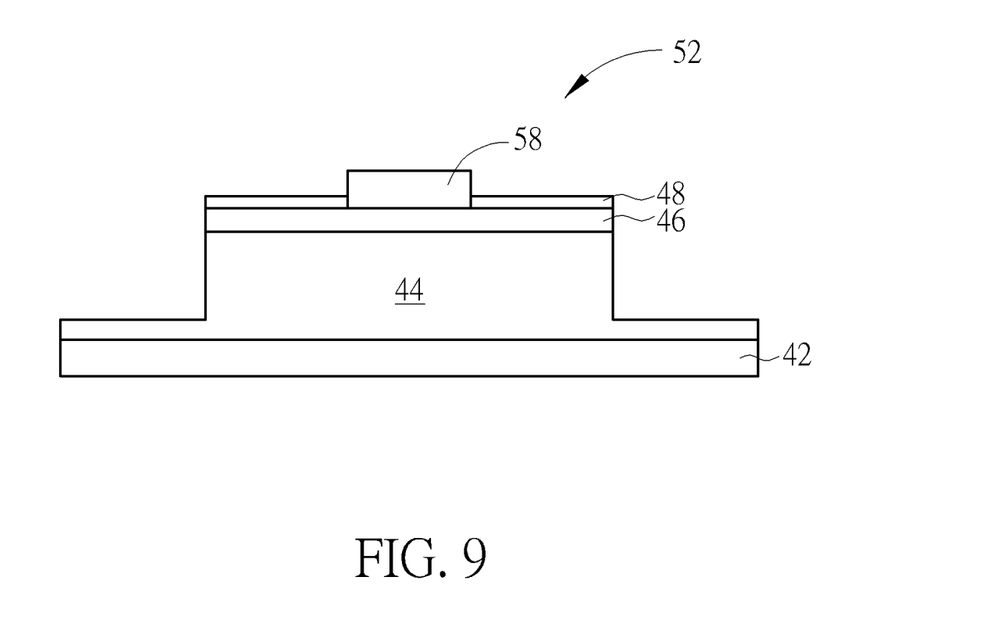

Next, as shown in FIG. 9, a p-type semiconductor layer 58 is formed on the barrier layer 46 within the recess 56, and the third hard mask 54 and second hard mask 50 are removed to expose the first hard mask 48 underneath. Similar to the aforementioned embodiment, the p-type semiconductor layer 58 preferably includes p-type GaN and the formation of the p-type semiconductor layer 58 on the barrier layer 46 within the recess 56 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Figure 10:
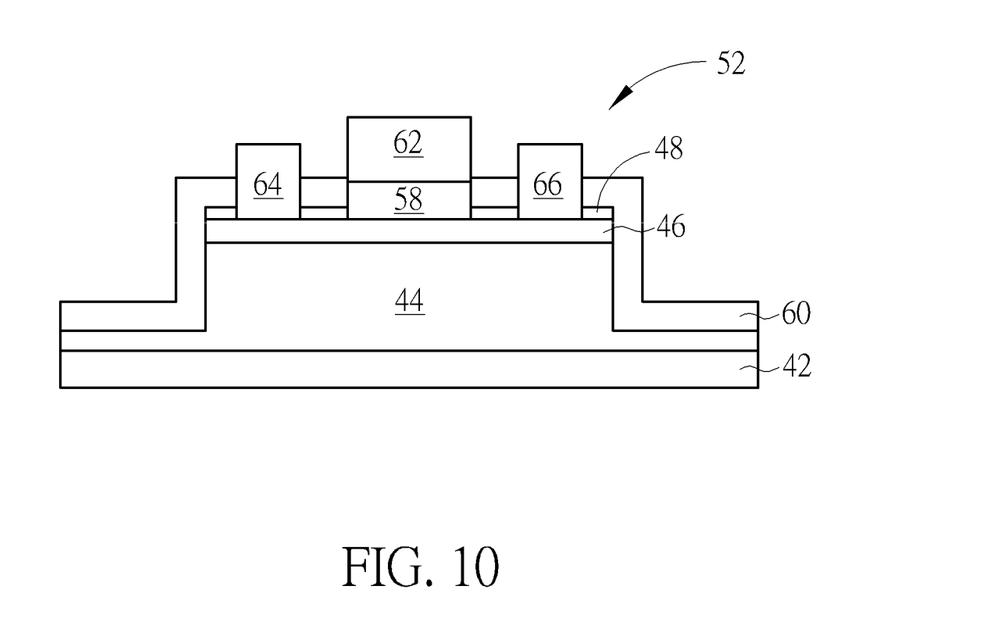

Next, as shown in FIG. 10, a passivation layer 60 is formed on the first has mask 48, the p-type semiconductor layer 58, and surface of the buffer layer 44 adjacent to two sides of the MESA area 52, a gate electrode 62 is formed on the p-type semiconductor layer 58, and a source electrode 64 and drain electrode 66 are formed adjacent to two sides of the gate electrode 62. In this embodiment, the formation of the gate electrode 62, the source electrode 64, and the drain electrode 66 could be accomplished by first conducting a photo-etching process to remove part of the passivation layer 60 directly on top of the p-type semiconductor layer 58 to form a recess (not shown), forming the gate electrode 62 in the recess, removing part of the passivation layer 60 and part of the first hard mask 48 adjacent to two sides of the gate electrode 62 to form two recesses (not shown), and then forming the source electrode 64 and drain electrode 66 in the two recesses.

In this embodiment, the gate electrode 62, the source electrode 64, and the drain electrode 66 are preferably made of metal, in which the gate electrode 62 is preferably made of Schottky metal while the source electrode 64 and the drain electrode 66 are preferably made of ohmic contact metals. According to an embodiment of the present invention, each of the gate electrode 62, source electrode 64, and drain electrode 66 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned recesses, and then pattern the electrode materials through one or more etching processes to form the gate electrode 62, source electrode 64, and the drain electrode 66. This completes the fabrication of a HEMT according to an embodiment of the present invention.

Overall, the present invention first forms a hard mask made of dielectric material including but not limited to for example silicon nitride on the surface of a AlGaN barrier layer, removes part of the hard mask and part of the AlGaN barrier layer to form a recess, and then forms a p-type semiconductor layer and gate electrode in the recess. By employing this approach the hard mask formed on the surface of the AlGaN barrier layer could be used to protect the AlGaN barrier layer from damages caused by various etchant during the fabrication process and also prevent issue such as stress degradation occurring after the formation of passivation layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating high electron mobility transistor (HEMT), comprising:
   forming a buffer layer on a substrate;
   forming a first barrier layer on the buffer layer;
   forming a first hard mask on the first barrier layer;
   removing the first hard mask and the first barrier layer to form a recess;
   forming a second barrier layer in the recess while the first hard mask is on the first barrier layer and sidewalls of the first hard mask and the second barrier layer are aligned; and
   forming a p-type semiconductor layer on the second barrier layer and directly contacting the first hard mask, wherein a topmost surface of the first hard mask is lower than a top surface of the p-type semiconductor layer.

2. The method of claim 1, further comprising:
   patterning the first hard mask, the first barrier layer, and the buffer layer;
   forming a second hard mask on the first hard mask and sidewalls of the first barrier layer and the buffer layer;
   forming the second barrier layer in the recess;
   forming the p-type semiconductor layer on the second barrier layer;
   removing the second hard mask;

forming a passivation layer on the first hard mask;
forming a gate electrode on the p-type semiconductor layer; and
forming a source electrode and a drain electrode adjacent to two sides of the gate electrode.

3. The method of claim 1, wherein the first barrier layer and the second barrier layer comprise $Al_xGa_{1-x}N$.

4. The method of claim 3, wherein the first barrier layer and the second barrier layer comprise different concentrations of Al.

5. The method of claim 3, wherein a concentration of Al of the second barrier layer is less than a concentration of Al of the first barrier layer.

6. The method of claim 1, wherein a thickness of the second barrier layer is less than a thickness of the first barrier layer.

7. The method of claim 1, wherein sidewalls of the p-type semiconductor layer and the second barrier layer are aligned.

* * * * *